(12) United States Patent
Kim et al.

(10) Patent No.: US 7,319,364 B2
(45) Date of Patent: Jan. 15, 2008

(54) AMPLIFIER CIRCUIT HAVING IMPROVED LINEARITY AND FREQUENCY BAND USING MULTIPLE GATED TRANSISTOR

(75) Inventors: Tae Wook Kim, Gyeonggi-do (KR); Bonkee Kim, Gyeonggi-do (KR); Kwyro Lee, Daejeon (KR)

(73) Assignee: Integrant Technologies Inc., Seongnam-si, Gyeonggi-do (KR)

( * ) Notice: Subject to any disclaimer, the term of this patent is extended or adjusted under 35 U.S.C. 154(b) by 163 days.

(21) Appl. No.: 11/281,580

(22) Filed: Nov. 18, 2005

(65) Prior Publication Data

US 2006/0091962 A1 May 4, 2006

(30) Foreign Application Priority Data

Dec. 20, 2004 (KR) ............. 10-2004-0108492

(51) Int. Cl.
*H03F 3/68* (2006.01)
*H03F 1/22* (2006.01)
(52) U.S. Cl. .............. 330/295; 330/283; 330/311
(58) Field of Classification Search ............ 330/311, 330/283

See application file for complete search history.

(56) References Cited

U.S. PATENT DOCUMENTS

| 6,407,640 | B1 * | 6/2002 | Aparin et al. ............ 330/302 |
| 6,674,337 | B2 * | 1/2004 | Hashemi et al. ........... 333/32 |
| 6,731,175 | B1 * | 5/2004 | Chen ..................... 330/311 |
| 2005/0062540 | A1 * | 3/2005 | Nakatani et al. .......... 330/294 |

* cited by examiner

*Primary Examiner*—Robert Pascal
*Assistant Examiner*—Alan Wong
(74) *Attorney, Agent, or Firm*—Foley & Lardner LLP (57) ABSTRACT

Disclosed herein is an amplifier circuit having improved linearity and frequency band using a MGTR. The amplifier circuit comprises an amplification unit including a main transistor and an auxiliary transistor, an attenuation unit including inductors respectively connected to the source of the main transistor and the source of the auxiliary transistor, a capacitor connected at one end thereof to the sources of the main transistor and auxiliary transistor and connected at the other end thereof to the gates of the main transistor and auxiliary transistor, and an output unit connected to the drains of the main transistor and auxiliary transistor.

5 Claims, 9 Drawing Sheets

FIG.1

PRIOR ART

FIG.9 freq (100.0MHz to 2.000GHz)

AMPLIFIER CIRCUIT HAVING IMPROVED LINEARITY AND FREQUENCY BAND USING MULTIPLE GATED TRANSISTOR

This Nonprovisional application claims priority under 35 U.S.C. § 119(a) on Patent Application No. 2004-0108492 filed in Korea on Dec. 20, 2004 the entire contents of which are hereby incorporated by reference.

FIELD OF THE INVENTION

The present invention relates to an amplifier circuit using a multiple gated transistor (MGTR), and more particularly, to an amplifier circuit having improved linearity and improved frequency band using a MGTR.

BACKGROUND OF THE RELATED ART

Figure 1:
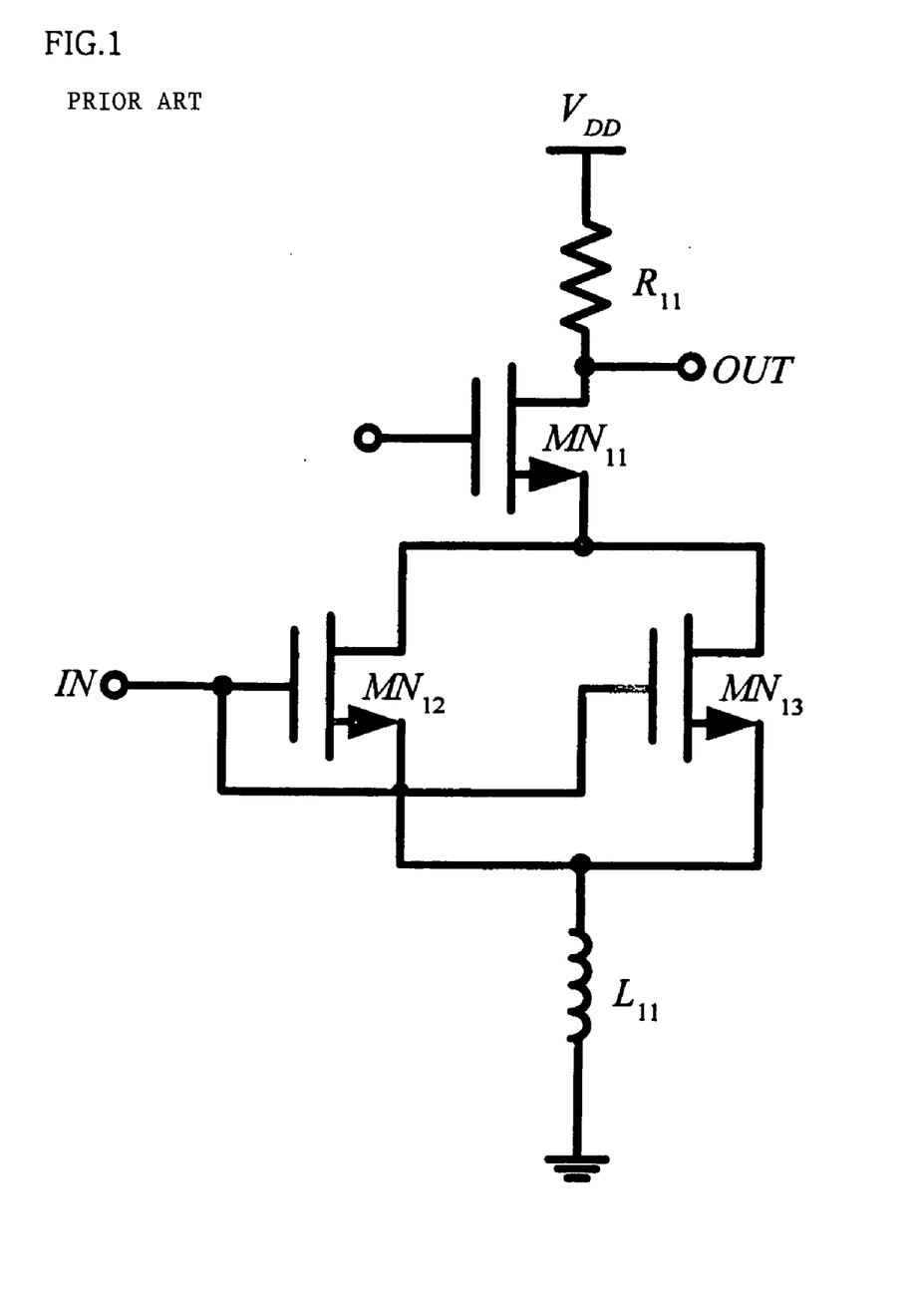
FIG. 1 is a circuit diagram of a conventional amplifier circuit using a MGTR.

FIG. 1 is a circuit diagram of a conventional amplifier circuit using a multiple gated transistor (MGTR).

Referring to FIG. 1, the conventional amplifier circuit includes a transistor MN11, a MGTR composed of a main transistor MN12 and an auxiliary transistor MN13, a resistor R11, and an inductor L11.

The gate, drain and source of the main transistor MN12 are respectively connected to the gate, drain and source of the auxiliary transistor MN13 to construct an amplification unit.

The sources of the main transistor MN12 and auxiliary transistor MN13 are connected to the inductor L11 to form an attenuation unit. The gates of the main transistor MN12 and auxiliary transistor MN13 are commonly connected to an input terminal.

The source of the transistor MN11 is connected to the drains of the transistors MN12 and MN13 of the amplification unit. The drain of the transistor MN11 is connected to the resistor R11 and the output terminal of an output unit.

The operation of the conventional amplifier circuit using a MGTR will now be explained.

An input signal is applied to the gates of the main transistor MN12 and auxiliary transistor MN13 to be amplified. Here, the operating characteristic of the auxiliary transistor MN13 is controlled to remove the third order intermodulation distortion IMD3 when the main transistor MN12 amplifies the input signal.

The operating characteristic of the transistor MN12 is different from that of transistor MN13 so that the linearity of the amplifier is improved. However, when an inductor is connected to the sources of the transistors MN12 and MN13, linearity improvement is mitigated, particularly, at a high frequency.

The inductor is inevitably added to the amplifier circuit for packaging Integrated Circuit(IC) chip or connecting to the circuit for input impedance matching.

When a low noise amplifier is designed, particularly, the inductor is added to the amplifier circuit for input impedance matching. In this case, when an inductive component is connected to the source of a transistor for series-negative feed-back, the inductive component corresponds to the real component of the input impedance from the gate of the transistor and thus the inductive component appears to be a resistor.

Here, the resistance of the resistor is gm*Ls/(Cgs) where gm is transconductance of the transistor, Ls is inductance of the inductive component, and Cgs is gate-source capacitance of the transistor.

This method is used to simultaneously accomplish noise figure optimization matching and input power matching in the case of a low noise amplifier.

According to this method, however, offset effect of gm" does not appear at a high frequency in the case of MGTR. When an inductor is connected to the source of a transistor, an imaginary component of gm" impedance is generated and becomes a component determining non-linearity. That is, a real component of gm" is effectively cancelled by a MGTR but the imaginary component of gm" is newly generated due to the inductor connected to the source of the transistor. Thus, linearity improvement effect of the MGTR is removed (referring to IEEE RFIC Symposium 2004 Fort Worth, Tex. USA 6-8, Jun. 2004').

Figure 2:
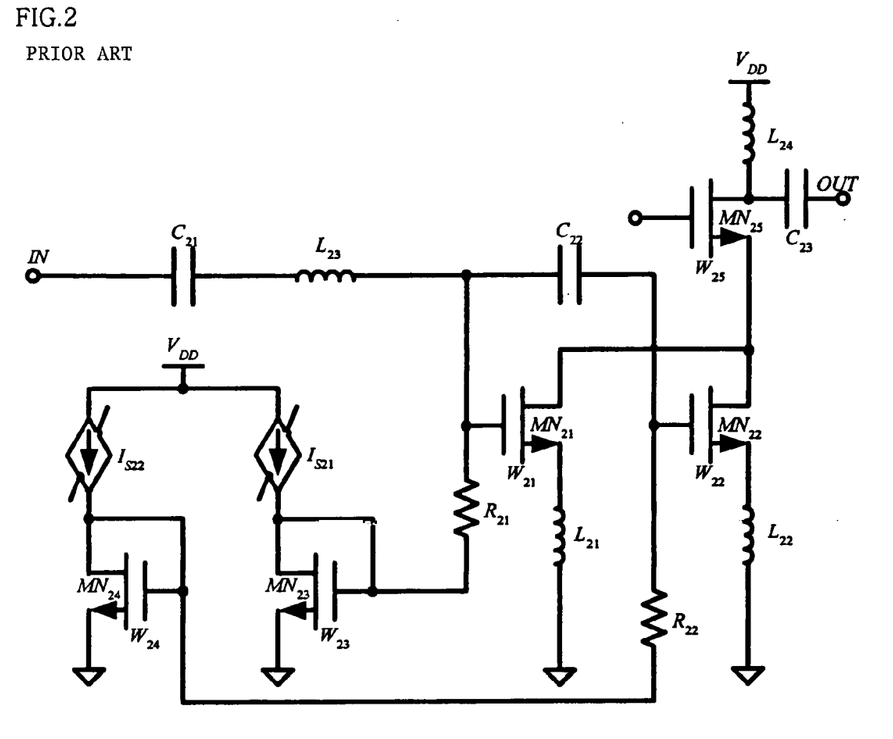
FIG. 2 is a circuit diagram of a conventional amplifier circuit disclosed in "IEEE RFIC Symposium 2004 Fort Worth, Tex. USA Jun. 6-8, Jun. 2004') and proposed by Qualcomm.

FIG. 2 is a circuit diagram of a conventional amplifier circuit using a MGTR to avoid the shortcomings of the amplifier circuit shown in FIG. 1. The amplifier circuit of FIG. 2 is disclosed in "IEEE RFIC Symposium 2004 Fort Worth, Tex. USB 6-8, Jun. 2004'" and proposed by Qualcomm.

Referring to FIG. 2, the amplifier circuit includes transistors MN21 through MN25, capacitors C21, C22 and C23, inductors L21, L22, L23 and L24, current sources Is21 and Is22, and resistors R21 and R22.

The drain of the main transistor MN21 is connected to the drain of the auxiliary transistor MN22, the source of the main transistor MN21 is connected to the inductor L21, and the source of the auxiliary transistor MN22 is connected to the inductor L22, to construct an amplification unit. Here, the inductors L21 and L22 have different characteristics.

An input terminal IN is serially connected to the capacitor C21 and the inductor L23, which are serially connected, and coupled to the gate of the main transistor MN21 such that an input signal is amplified. The capacitor C22 is inserted between the gate of the main transistor MN21 and the gate of the auxiliary transistor MN22 to amplify the input signal using the auxiliary transistor M22.

The output of the current source Is21 is applied to the drain and gate of the transistor MN23 for biasing, the output of the current source Is22 is applied to the drain and gate of the transistor MN24 for biasing, and the current sources Is21 and Is22 receive a power supply voltage Vdd.

The resistor R21 is serially connected between the gate of the transistor MN23 and the gate of the main transistor MN21 and the resistor R22 is serially connected between the gate of the transistor MN24 and the gate of the auxiliary transistor MN22 to bias the transistors MN21 and MN22. The drain of the transistor M25 is connected to the capacitor C23 to construct an output terminal and the source of the transistor MN25 is connected to the drains of the transistors MN21 and MN22 to output a signal.

In the amplifier circuit of FIG. 2, the inductors L21 and L2 having different characteristics are respectively connected to the main transistor MN21 and the auxiliary transistor MN22 in order to improve linearity. In this case, however, the amplifier circuit requires one more inductor than the amplifier circuit of FIG. 1. In addition, it is difficult to determine the inductance of the inductor L22 of the auxiliary transistor MN22 and the amplifier circuit is applied only to a narrow band. Furthermore, there is no method for processing induced gate noise (referring to IEEE RFIC Symposium 2004 Fort Worth, Tex. USA 6-8, Jun. 2004') generated in the auxiliary transistor.

SUMMARY OF THE INVENTION

Accordingly, the present invention has been made to solve the above-mentioned problems, and it is an object of the present invention is to provide an amplifier circuit for improving a frequency band while enhancing linearity.

Another object of the present invention is to provide an amplifier circuit capable of reducing the influence of a degeneration inductor of a MGTR and decreasing the influence of induced gate noise generated in an auxiliary transistor to improve a noise figure.

To accomplish the above objects, according to one aspect of the present invention, there is provided an amplifier circuit having improved linearity and frequency band using a MGTR, comprising: an amplification unit including a main transistor and an auxiliary transistor; an attenuation unit including inductors respectively connected to the source of the main transistor and the source of the auxiliary transistor; a capacitor connected at one end thereof to the sources of the main transistor and auxiliary transistor and connected at the other end thereof to the gates of the main transistor and auxiliary transistor; and an output unit connected to the drains of the main transistor and auxiliary transistor.

Preferably, the main transistor and the auxiliary transistor have different characteristics. The output unit can include a transistor.

Another aspect of the present invention, there is also provided an amplifier circuit having improved linearity and frequency band using a MGTR, comprising: an amplification unit including a main transistor and an auxiliary transistor; an attenuation unit including inductors respectively connected to the source of the main transistor and the source of the auxiliary transistor; a capacitor connected at one end thereof to the sources of the main transistor and auxiliary transistor and connected at the other end thereof to the gates of the main transistor and auxiliary transistor; an output unit connected to the drains of the main transistor and auxiliary transistor, the output unit including a transistor; and a feedback amplifier connected between a gate and a source of the transistor of the output unit.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Figure 3:
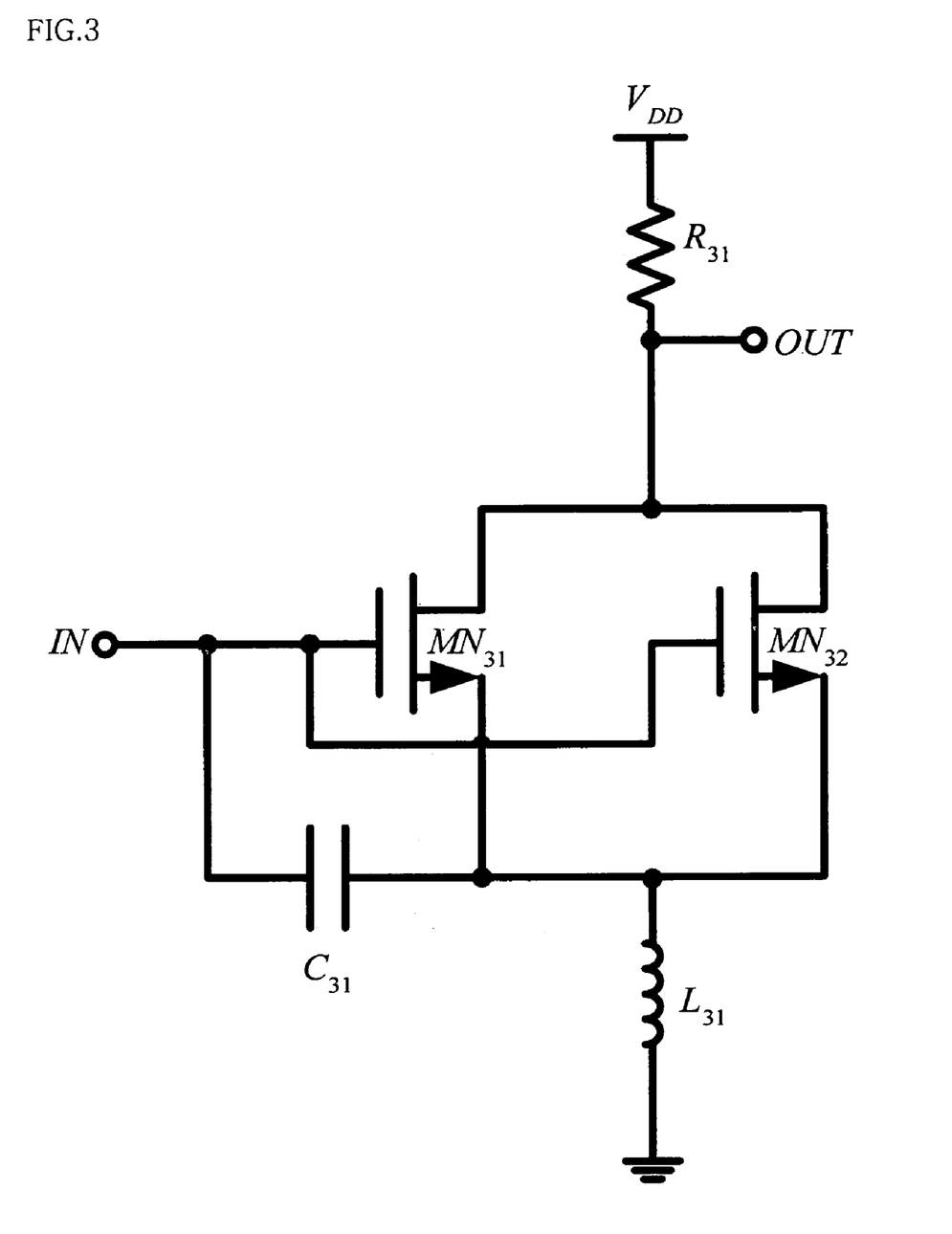
FIG. 3 is a circuit diagram of a common source amplifier circuit having improved linearity and frequency band using a MGTR according to a first of the present invention.
Figure 4:
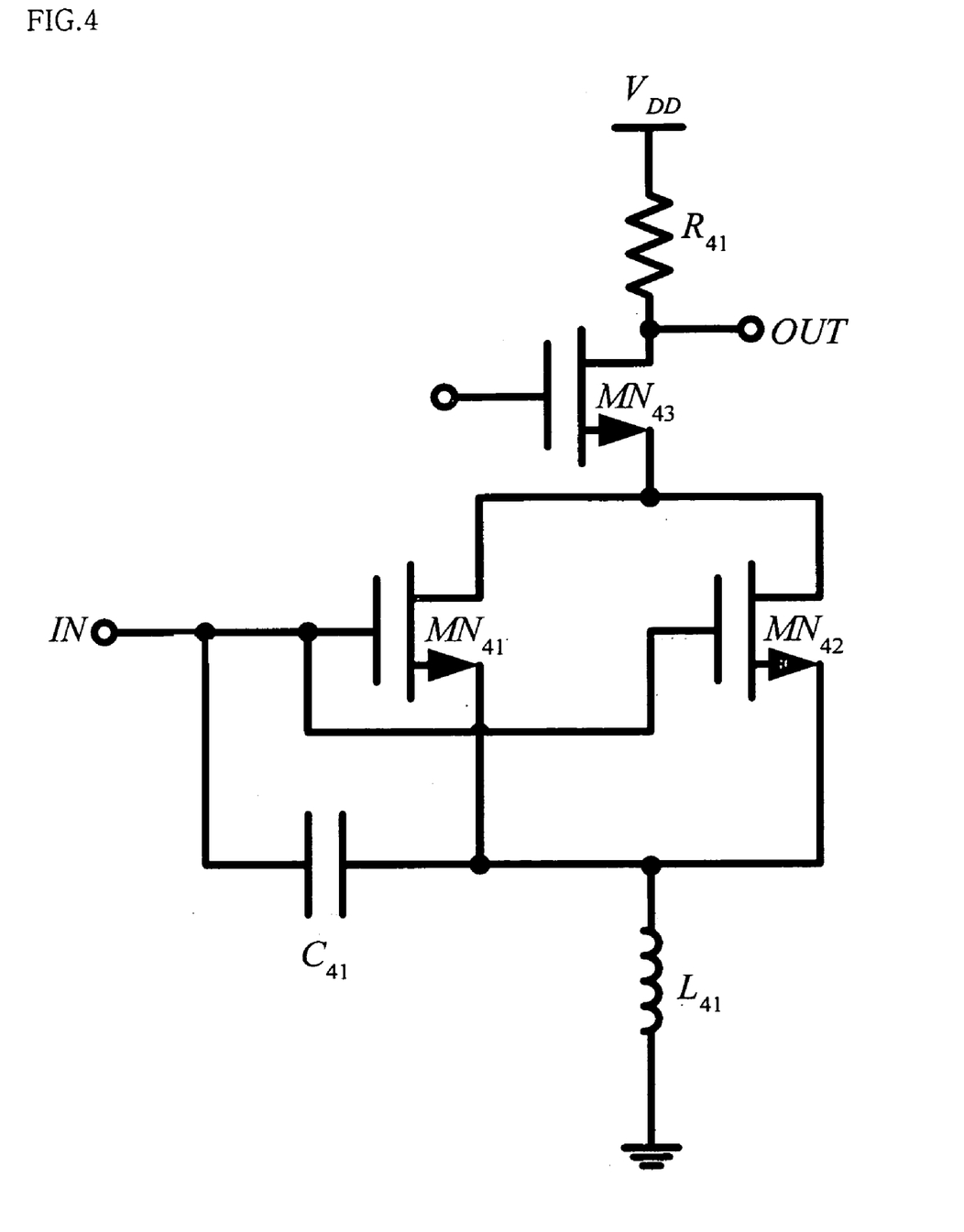
FIG. 4 is a circuit diagram of a cascode amplifier circuit having improved linearity and frequency band using a MGTR according to a second embodiment of the present invention.

FIG. 3 is a circuit diagram of a common source amplifier circuit having improved linearity and improved frequency band using a MGTR according to a first of the present invention, and FIG. 4 is a circuit diagram of a cascode amplifier circuit having improved linearity and improved frequency band using a MGTR according to a second embodiment of the present invention. Since amplification units of the amplifier circuits of FIGS. 3 and 4 have the same configuration, only the cascode amplifier circuit of FIG. 4 will now be explained.

Referring to FIG. 4, the amplifier circuit includes a MGTR composed of a main transistor MN41 and an auxiliary transistor MN42, a transistor MN43, an inductor L41, a capacitor C41, and a resistor R41. The gate, drain and source of the main transistor MN41 are respectively connected to the gate, drain and source of the auxiliary transistor MN42, the sources of the main transistor MN41 and auxiliary transistor MN42 are connected to each other such that the main transistor MN41 and auxiliary transistor MN42 are coupled to each other to construct an amplification unit.

The source of the main transistor MN41, the source of the auxiliary transistor MN42 and one end of the inductor L41 are commonly connected to construct an attenuation unit. The capacitor C41 is connected at one end thereof to the gates of the main transistor MN41 and auxiliary transistor MN42, and is connected at the other end thereof to the sources of the main transistor MN41 and auxiliary transistor MN42.

The drain of the transistor MN43 is connected to one end of the resistor R41 and an output terminal OUT to construct an output unit, and the source of the transistor MN43 is connected to the drains of the main transistor MN41 and auxiliary transistor MN42. Here, characteristic of the auxiliary transistor MN42 for reducing IMD3 generated when the main transistor MN41 amplifies a signal is determined. However, when an inductor is inevitably connected to the source of a transistor because of a package or an inductor is added to the amplifier circuit for input matching, feedback of secondary harmonic components 2f1, 2f2 and f1+f2 is generated between the gate and source of the transistor through the inductor. Through this feedback, imaginary components of gm" are generated and thus linearity improvement according to a MGTR is not obtained at a high frequency.

Accordingly, the present invention connects one end of the capacitor C41 to the input terminal IN and the gates of the transistors MN41 and MN42 and connects the other end of the capacitor C41 to the sources of the transistors MN41 and MN42 to reduce the quantity of amplification of the secondary harmonic components, thereby decreasing the influence of the feedback. Thus, linearity improvement according to a MGTR can be obtained even at a high frequency.

Particularly, the amplifier circuit of FIG. 4 can be used for a narrow band when it is matched to the narrow band because there is no frequency resonating when the amplifier circuit amplifies a signal.

Figure 5:
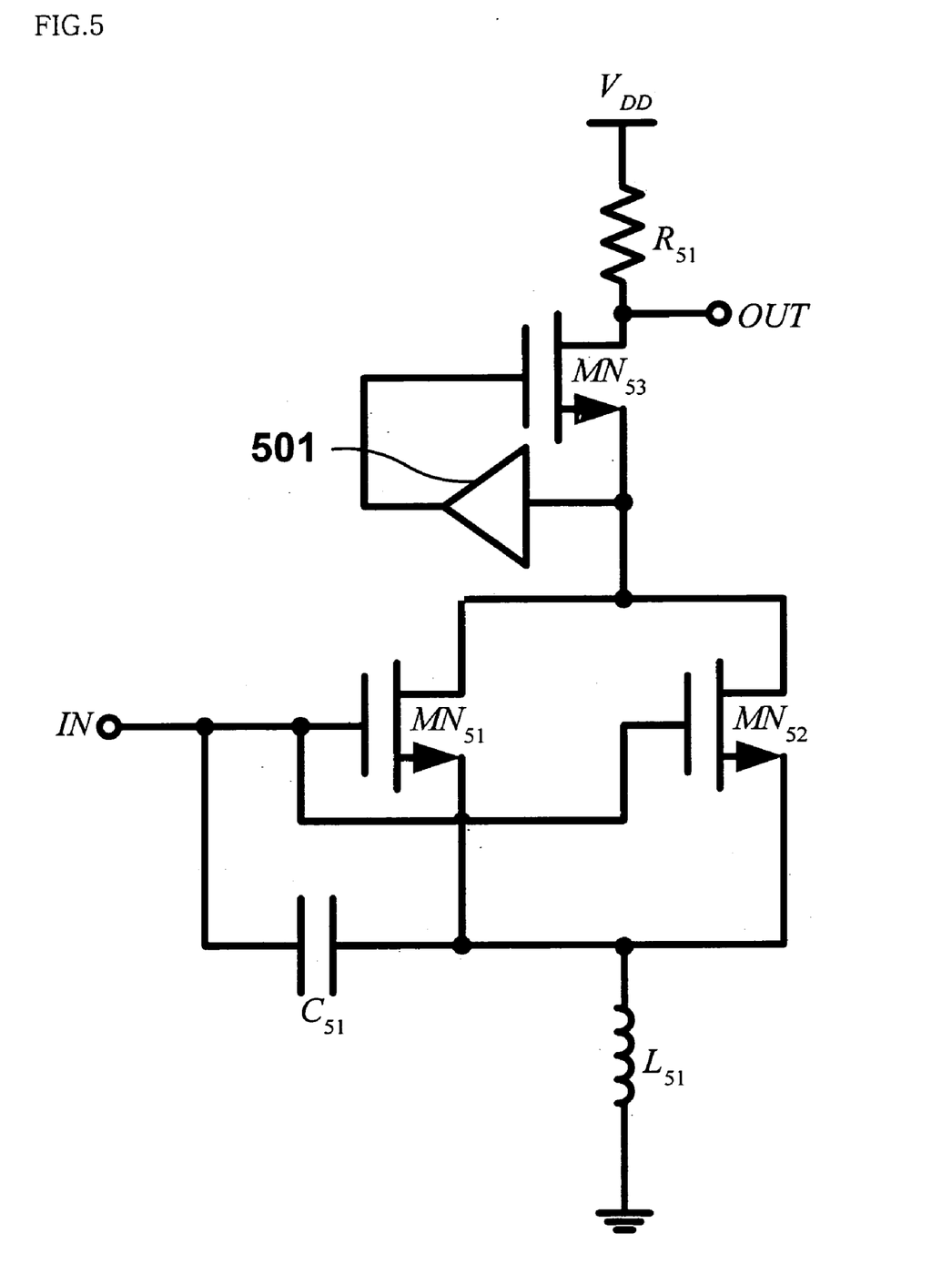
FIG. 5 is a circuit diagram of an amplifier circuit having improved linearity and frequency band using a MGTR according to a third embodiment of the present invention.

FIG. 5 is a circuit diagram of an amplifier circuit having improved linearity and frequency band using a MGTR according to a third embodiment of the present invention. Referring to FIG. 5, the amplifier circuit includes transistors MN51, MN52 and M53, an inductor L51, a capacitor C51, a resistor R51, and a feedback amplifier 501. Since the basic configuration of the amplifier circuit of FIG. 4 is similar to that of the amplifier circuit of FIG. 3 and only the feedback amplifier part is different from the amplifier circuit of FIG. 3, only the feed-back amplifier 501 will now be explained.

The output port of the feedback amplifier 501 is connected to the gate of the transistor MN53 and the input port of the feedback amplifier 501 is connected to a node coupled to the source of the transistor MN53 and the drains of the MGTR MN51 and MN52. That is, the feedback amplifier 501 is added between the gate and source of the transistor MN53 to increase the impedance of a common gate input (input of the transistor MN53) by a feedback loop gain in the cascode circuit. In this case, the common gate input impedance is reduced and thus feedback between the gate and drain, called Miller effect in general, can be decreased. That is, harmonic feedback effect generated at the drains of the MGTR MN51 and MN52 is reduced to improve linearity by approximately 2 to 3 dB.

Figure 6:
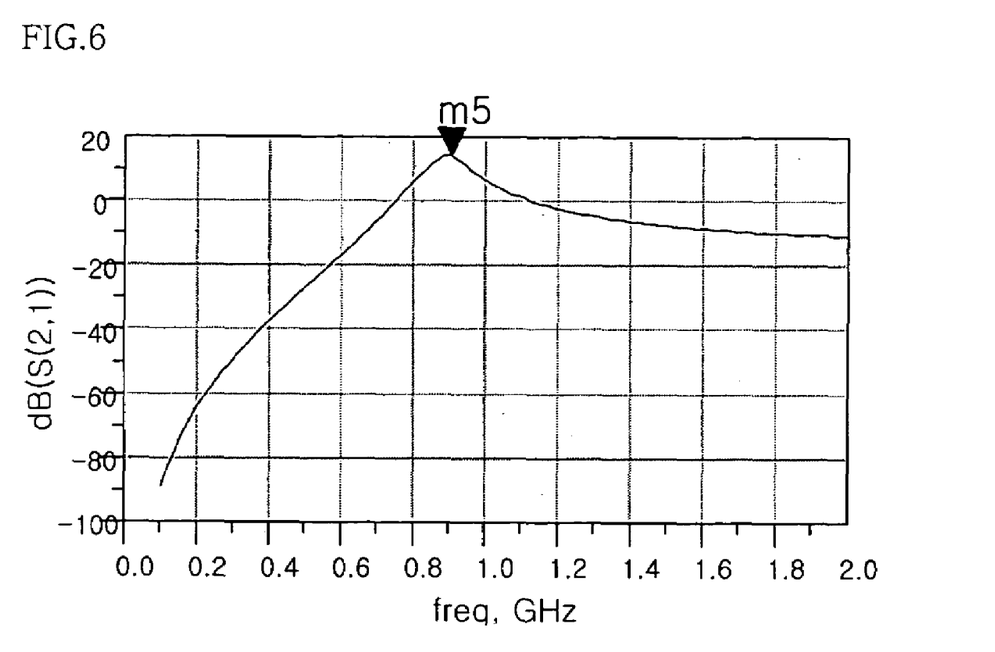
FIG. 6 is a gain graph showing a simulation result of an amplifier circuit according to an embodiment of the present invention.

FIG. 6 is a gain graph showing a simulation result of an amplifier circuit according to an embodiment of the present invention. Referring to FIG. 6, the maximum gain is obtained when an input frequency is 906.1 MHz. Here, dB(S(2,1)) of a gain point m5 is 14.222 dB that is the maximum gain.

Figure 7:
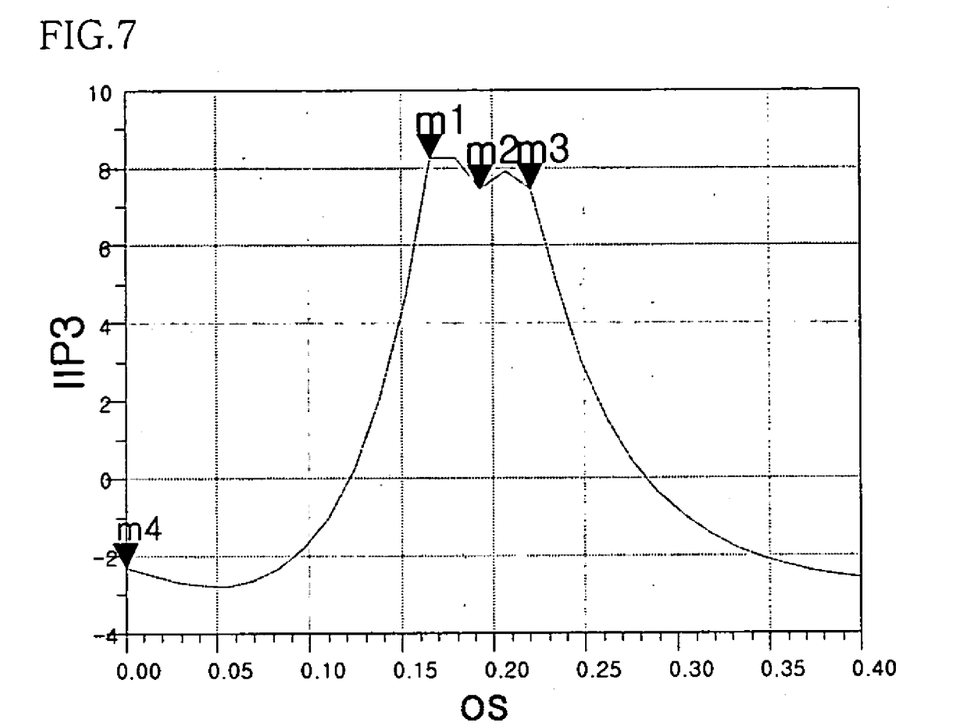
FIG. 7 is an IIP3 graph showing a simulation result of an amplifier circuit according to an embodiment of the present invention.

FIG. 7 is an IIP3 graph showing a simulation result of an amplifier circuit according to an embodiment of the present invention. Referring to FIG. 7, IIP3 is 8.240 dBm when indep (m1) is 0.166, IIP3 is 7.449 dBm when indep (m2) is 0.193, IIP3 is 7.470 dBm when indep (m3) is 0.221, and IIP3 is −2.286 dBm when indep (m4) is 0.000. Here, indep (m4) is 0.000 in the case of a conventional cascode circuit using no MGTR. That is, the maximum IIP3 is 8.2409 dBm and thus IIP3 is improved by approximately 10 dB according to the MGTR.

Figure 8:
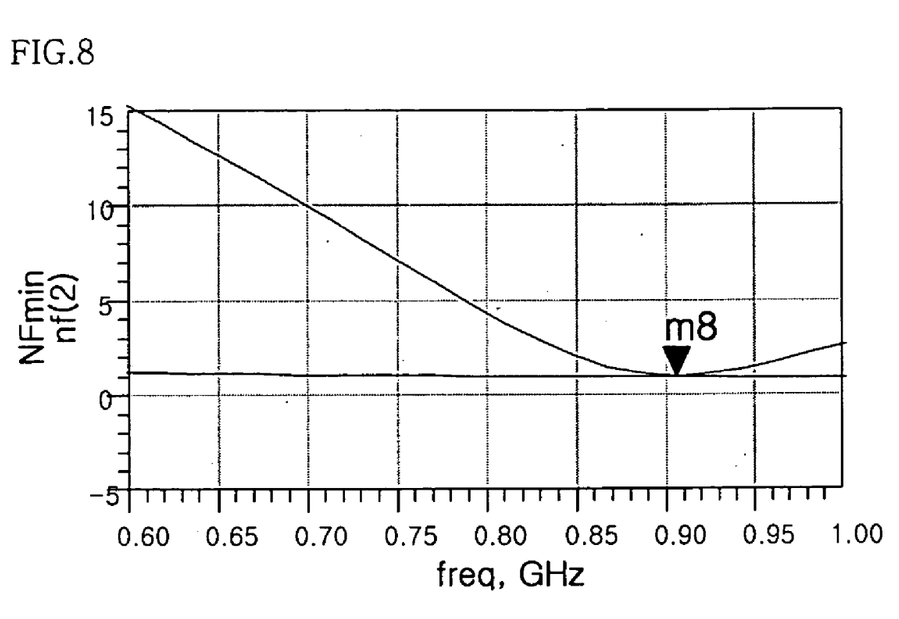
FIG. 8 is a noise figure graph showing a simulation result according to an embodiment of the present invention.

FIG. 8 is a noise figure (NF) graph showing a simulation result according to an embodiment of the present invention. As shown in FIG. 8, the noise figure is 0.983 dB when a frequency is 906.1 MHz.

Figure 9:
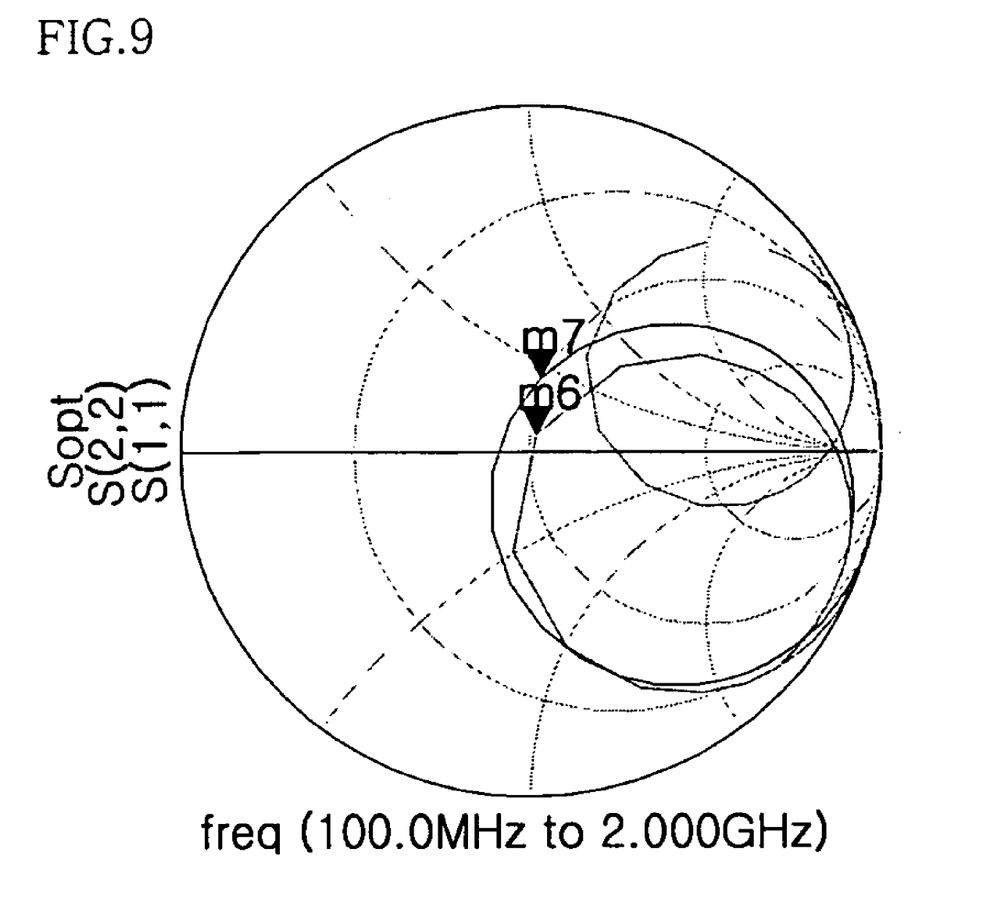
FIG. 9 is a Smith chart showing a simulation result according to an embodiment of the present invention.

FIG. 9 is a Smith chart showing a simulation result according to an embodiment of the present invention. Referring to FIG. 9, when an input frequency is 906.1 MHz, S(1,1) is 0.054/68.915 and impedance is Zo*(1.034+j0.104). When the input frequency is 886.9 MHz, S(2,2) is 0.216/81.239 and impedance is Zo*(0.972+j0.435).

Table 1 represents the simulation results of FIGS. 6, 7, 8 and 9.

TABLE 1

| | Freq. (GHZ) | S21 (dB) | NF (dB) | IIP3 (dBm) | Pdc (mA@V) | FOM |
|---|---|---|---|---|---|---|
| Present invention | 0.9 | 14.2 | 0.98 | +8.0 | 1.6@1.8 | 230.0 |
| Qualcomm | 0.9 | 15.5 | 1.60 | +17.2 | 9.0@2.6 | 179.0 |

In Table 1, FOM (Figure of Merit) is an index for characteristic comparison and it is calculated according to [OIP3/[Noise Factor−1]*Pdc] that is the calculation method of the reference paper (IEEE RFIC Symposium 2004 Fort Worth, Tex. USA 6-8, Jun. 2004').

The present invention significantly reduces the influence of a degeneration inductor of the amplifier circuit using a MGTR and decreases the influence of induced gate noise generated in the auxiliary transistor. In addition, the present invention improves a noise figure and characteristic after matching. Moreover, the amplifier circuits according to the present invention can be applied to a broadband. Furthermore, the present invention can also easily determine the capacitance of the capacitor C31 of the amplifier circuit and construct an amplifier circuit using a small number of elements to reduce power consumption. Accordingly, the amplifier circuits of the present invention can be applied to a circuit requiring low power consumption.

The present invention inserts a capacitor to an amplifier circuit to reduce the influence of a degeneration inductor and decrease induced gate noise generated in an auxiliary transistor of the amplifier circuit, and enhances linearity of the amplifier circuit to improve a noise figure and allows the amplifier circuit to be applied to a broadband. Furthermore, present invention minimizes the number of elements added to the amplifier circuit for improving linearity by inserting the capacitor to the amplifier circuit. Accordingly, power consumption of the amplifier circuit is decreased so that various circuits using the amplifier circuit can be easily constructed.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An amplifier circuit having improved linearity and frequency band using a MGTR, comprising:
    an amplification unit including a main transistor and an auxiliary transistor;
    an attenuation unit including at least one inductor respectively connected to the source of the main transistor and the source of the auxiliary transistor;
    a capacitor connected at one end thereof to the sources of the main transistor and auxiliary transistor and connected at the other end thereof to the gates of the main transistor and auxiliary transistor; and
    an output unit connected to the drains of the main transistor and auxiliary transistor.

2. The amplifier circuit of claim 1, wherein the main transistor and the auxiliary transistor have different characteristics.

3. The amplifier circuit of claim 1, wherein the output unit includes a transistor.

4. An amplifier circuit having improved linearity and frequency band using a MGTR, comprising:
    an amplification unit including a main transistor and an auxiliary transistor;
    an attenuation unit including at least one inductor respectively connected to the source of the main transistor and the source of the auxiliary transistor;
    a capacitor connected at one end thereof to the sources of the main transistor and auxiliary transistor and connected at the other end thereof to the gates of the main transistor and auxiliary transistor;

an output unit connected to the drains of the main transistor and auxiliary transistor, the output unit including a transistor; and a feedback amplifier connected between a gate and a source of the transistor of the output unit.

5. The amplifier circuit of claim 4, wherein the main transistor and the auxiliary transistor have different characteristics.

* * * * *